United States Patent [19]

Iranmanesh et al.

[11] Patent Number: 4,933,733
[45] Date of Patent: Jun. 12, 1990

[54] SLOT COLLECTOR TRANSISTOR

[75] Inventors: Ali Iranmanesh; Christopher O. Schmidt, both of Sunnyvale, Calif.

[73] Assignee: Advanced Micro Devices, Inc., Sunnyvale, Calif.

[21] Appl. No.: 929,543

[22] Filed: Nov. 12, 1986

Related U.S. Application Data

[63] Continuation of Ser. No. 740,361, Jun. 3, 1985, abandoned.

[51] Int. Cl.⁵ .................................... H01L 29/72
[52] U.S. Cl. .................................... 357/34; 357/55; 357/59
[58] Field of Search ............... 357/34, 55, 47, 49, 357/59 H

[56] References Cited

U.S. PATENT DOCUMENTS 3,913,124 10/1975 Roberson .................... 357/34
4,089,021 5/1978 Sato et al. .................... 357/34
4,269,636 5/1981 Rivoli .................... 357/34

OTHER PUBLICATIONS

IBM Technical Disclosure Bulletin vol. 23 #9 Feb. 1981 by Horng, p. 4137.

Primary Examiner—Andrew J. James
Assistant Examiner—Mark Prenty

[57] ABSTRACT

An improved semiconductor device is presented, the improvement comprising a slot collector contact region (38). The slot collector contact region (38) is formed in a semiconductor substrate (39) adjacent to base and emitter regions (40,44) of the bipolar semiconductor device. The slot collector contact region (38) is comprised of a slot filled with a filler material. In a preferred embodiment of the invention, the slot collector contact region (38) is separated from the base and emitter regions (40,44) by an insulating layer (52).

7 Claims, 2 Drawing Sheets

SLOT COLLECTOR TRANSISTOR

This application is a continuation of application Ser. No. 06/740,361, filed 06/03/85 and now abandoned.

DESCRIPTION

1. Field of the Invention

This invention relates to bipolar transistor devices in semiconductor integrated circuits, and more particularly to a unique bipolar transistor device having a slot collector region.

2. Background of the Invention

In conventional bipolar transistors in integrated circuits, a buried layer is typically formed as part of the transistor to reduce parasitic collector resistance. In conjunction with the use of a buried layer, a deep impurity region is often formed as part of the transistor. This impurity region functions as a collector contact, and is commonly known as a "sinker". The sinker typically extends to such a depth that it meets the buried layer, and operates to reduce the collector series resistance due to the vertical path between the buried layer and the collector contact on the upper surface of the substrate. The sinker is separated from the base region of the transistor by a region of oxide, in order to minimize capacitance and maximize breakdown voltage.

The conventional bipolar transistor, as described above, is limited in the degree to which its device geometry can be reduced, due, in part, to lateral diffusion of the sinker and encroachment of the oxide isolation region into the collector contact and active areas of the transistor.

It would be desirable, therefore, to develop a bipolar transistor having a structure that would allow the collector contact to be moved very close to the transistor base, thus allowing a reduction of device geometry and, therefore, increased packing densities on integrated circuits. In fact, the resulting structure could be so closely packed that it would also be desirable to eliminate the buried layer normally included in high performance bipolar transistors.

SUMMARY OF THE INVENTION

It is therefore an object of this invention to provide a bipolar transistor having a slot collector region.

It is another object of this invention to provide a bipolar transistor having a structure which allows a reduction in device geometry.

It is a further object of this invention to provide a bipolar transistor having a structure in which the distance between the collector contact and the active base-emitter area of the transistor is reduced to a point where lateral resistance in the transistor is negligible in comparison to vertical resistances.

In accordance with the invention, a slot collector region is provided in a bipolar transistor formed in a semiconductor substrate. The transistor structure of a preferred embodiment of the present invention includes a collector diffusion region of a second conductivity type formed in a substrate of a first conductivity type; a slot collector region formed in the collector diffusion region, the slot collector region having a depth less than the collector diffusion region; a collector insulating layer formed on a first sidewall of the slot collector region, the collector insulating layer extending to a depth in the substrate less than the depth of the slot collector region; a base region of a first conductivity type formed in the collector diffusion region; an emitter region of a second conductivity type formed in the base region; and first and second slot isolation regions formed in the substrate and extending to a depth greater than the depth of the collector diffusion region such that the first and second slot isolation regions operate to isolate the bipolar transistor from other active transistor regions in the integrated circuit.

The foregoing and other objects, features and advantages of the invention will be apparent from the following detailed description of the preferred embodiments of the invention when read in conjunction with the accompanying drawings, with like reference numerals representing corresponding parts throughout.

DETAILED DESCRIPTION OF THE PRESENT INVENTION

Reference is now made in detail to a specific embodiment of the present invention, which illustrates the best mode presently contemplated by the inventors for practicing the invention, the preferred embodiment of which is set forth in the accompanying drawings. The drawings referred to in this description are understood to be not drawn to scale and to illustrate only one portion of an integrated circuit fabricated in accordance with the present invention.

Figure 1:
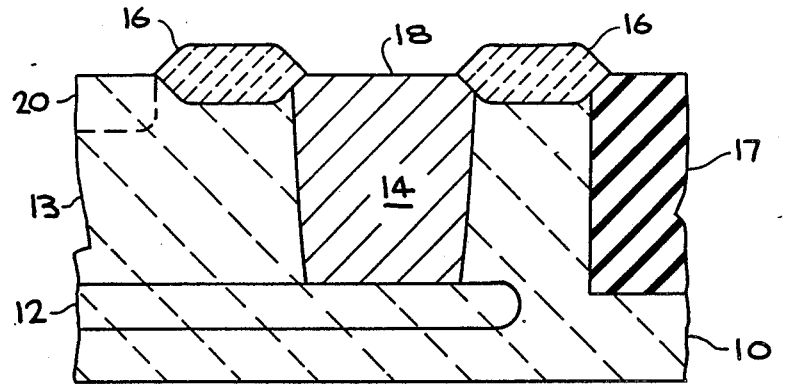
FIG. 1 is a cross-section showing a prior art bipolar transistor having a buried layer, a sinker, an oxide separation region, a portion of the base of the transistor and an isolation region formed in a semiconductor substrate.

FIG. 1 is a cross-section of a portion of a prior art bipolar transistor formed in a semiconductor substrate 10. The prior art device shown includes a buried layer 12, a sinker 14, an oxide separation region 16 (appearing in the cross-section of FIG. 1 as two "separate" oxide regions) and an isolation region 17. The oxide region 16 electrically separates collector contact area 18 from an additional base area 20 of the device, and the isolation region 17 separates adjacent transistor structures. A major disadvantage of this prior art device is that the distance between the collector contact area 18 and the additional active area 20 cannot be reduced due to the miminum required size of the oxide region 16 as governed by restrictions on capacitance and junction breakdown voltage. This limits the amount by which the overall device geometry can be reduced. Furthermore, since the collector contact is separated laterally from the active base region, the associated series collector resistance will be large without the inclusion of the buried layer 12. This, in turn, requires that an epitaxial layer 13 be deposited on the substrate 10.

Figure 2:
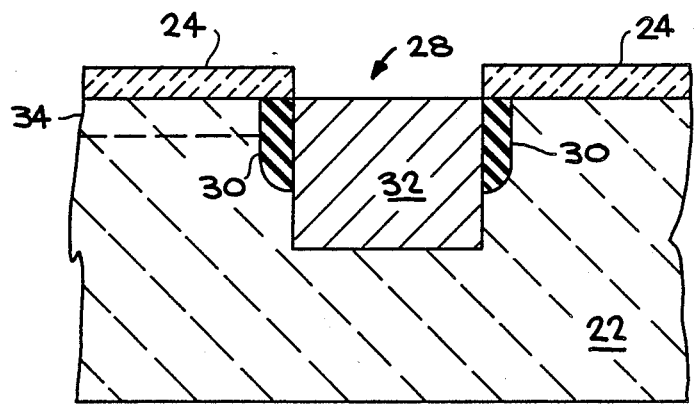
FIG. 2 is a cross-section of a slot collector structure in accordance with the present invention.

The present invention comprises a semiconductor device having a slot collector contact region which eliminates the need for a large oxide separation region, like region 16 of FIG. 1. FIG. 2 is a cross-section of a slot collector structure in accordance with the present invention. A method of fabricating the slot collector region of the present invention is described in copending U.S. patent application Ser. No. 711,701, assigned to the common assignee designated herein and now abandoned. The slot collector is comprised of a slot 28 formed in a substrate 22 and filled with a filler material 32. An insulating layer 30 is formed on portions of the sidewalls of the slot 28, as shown in FIG. 2. The insulating layer 30 is not present on the bottom of the slot 28, so that current can flow between the slot region 28 and the underlying substrate 22.

The filled slot 28 functions as a collector region of a bipolar transistor. Since the filled slot 28 is to function as a collector region of a bipolar transistor, the filler material 32 should have certain properties to meet the design parameters determined by the designer, either in its "as deposited" state, or after any additional steps required to provide these properties. Usually, for example, the filler material 32 should provide a low resistance path for the collector current. Alternatively, materials which reduce the bulk recombination in the filled slot region, such as polysilicon or semi-insulating polysilicon (sipos), can be used to fill the slot 28. These materials, although having a higher collector resistance, provide a higher reverse current gain, which is desirable, for example, in linear circuit applications, or to reduce current hogging in a circuit. Providing a high reverse current gain can be further facilitated by eliminating the buried layer typically included in prior art structures such as that shown in FIG. 1.

As can be seen in FIG. 2, the great advantage of the present invention is that it allows a reduction in the distance between the collector region and a base area 34 of the transistor. In the embodiment of the present invention illustrated in FIG. 2, this distance can be reduced to as little as the thickness of the insulating layer 30, which provides separation between the collector contact region and the active area 34. Even without the insulating layer 30, a reduction in spacing between the collector region and the additional active region 34 can be achieved, since the lateral diffusion from the slot filler material 32 can be reduced to zero. In prior art structures, such as that shown in FIG. 1, the distance between the collector contact area and the base-emitter active area is typically 2 or more microns. Using the slot collector region of the present invention, this distance can be reduced to much less than 1 micron, and as little as 0.1 micron, resulting in a significant reduction in the overall size of the transistor. In fact, the lateral distance can be less than the vertical distance necessary to guarantee separation between the collector contact and the adjacent region 34.

Figure 3:
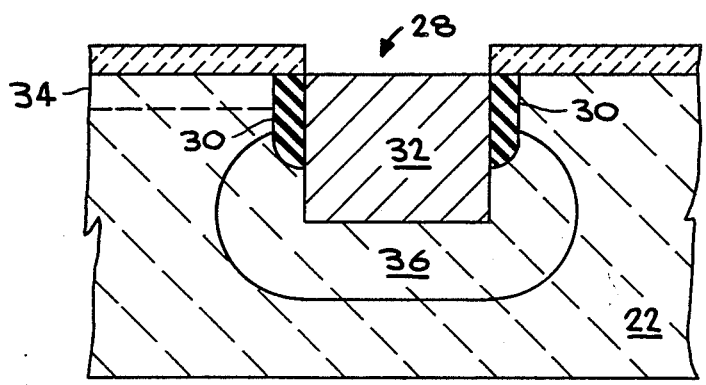
FIG. 3 is a cross-section of a second embodiment of the slot collector structure shown in FIG. 2 having an impurity region formed under the filled slot.

Referring now to FIG. 3, if a further reduction in collector resistance is desired, an impurity region 36 can be formed underneath the filled slot 28. This may be desirable, for example, when the buried layer has been eliminated, resulting in an increase in collector resistance.

The impurity region 36 can be formed by diffusing or implanting impurities into the substrate 22 before filling the slot 28. Alternatively, with certain selected filler materials such as polysilicon, the slot 28 can be filled in such a manner that the filler material 32 will "out-diffuse" from the walls and bottom of the slot 28, thereby forming the impurity region 36.

Figure 4:
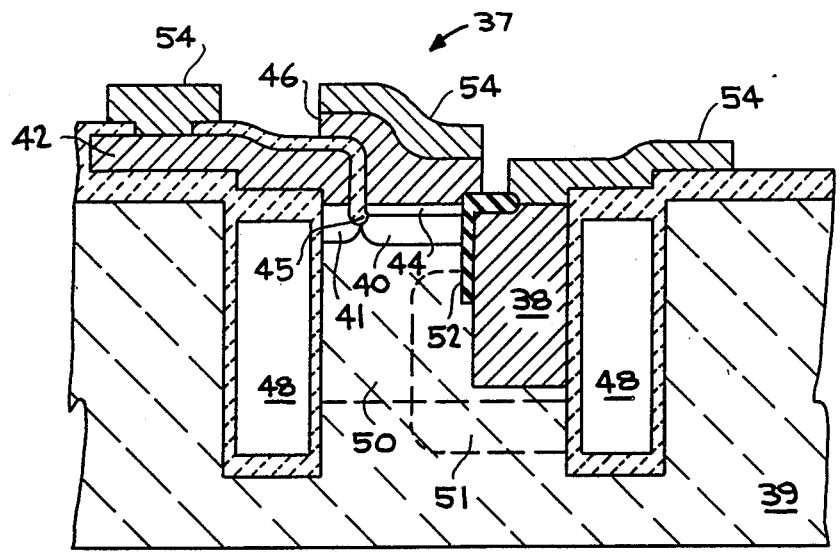
FIG. 4 is a cross-section showing a first embodiment of a slot collector transistor of the present invention.

FIG. 4 shows a bipolar semiconductor device embodiment 37 having a slot collector region 38 in accordance with the present invention. In addition to the collector region 38, the structure illustrated in FIG. 4 includes semiconductor substrate 39, instrinsic base region 40, extrinsic base region 41, base contact 42, emitter region 44, emitter contact 46, slot isolation regions 48, collector diffusion 50, local collector diffusion 51, collector insulating layer 52 and conductive lines 54.

As can be seen in FIG. 4, the emitter region 44 is isolated from the extrinsic base region 41, which is the base contact region, by an emitter isolation region 45. The emitter isolation region 45 is the subject of U.S. Pat. No. 4,641,416, issued Feb. 10, 1987, by the same inventors as the instant application, assigned to a common assignee. Also, as explained above, the local collector diffusion 51, similar to the impurity region 36, functions to further reduce collector resistance.

As illustrated in FIG. 4, the distance between the collector region 38 and the base emitter regions 40, 44 is defined solely by the thickness of the collector insulating layer 52. Thus, the distance between the collector region 38 and the base, emitter regions 40, 44 can be reduced to a distance equivalent to the smallest insulating layer thickness that can be reliably formed, or as limited by capacitance requirements of the circuit.

Figure 5:
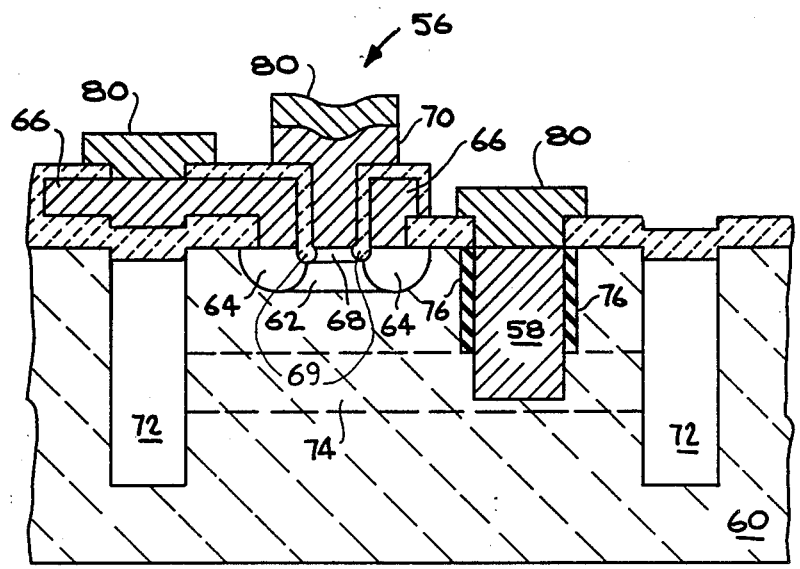
FIG. 5 is a cross-section showing a second embodiment of a slot collector transistor of the present invention.

FIG. 5 shows an alternative bipolar semiconductor device embodiment 56 having a slot collector region 58 in accordance with the present invention. In addition to collector region 58, the structure illustrated in FIG. 5 includes semiconductor substrate 60, intrinsic base region 62, extrinsic base region 64, base contact 66, emitter region 68, emitter contact 70, slot isolation regions 72, buried layer 74, collector insulating layer 76, and conductive lines 80. The emitter region 68 is isolated from extrinsic base regions 64 by emitter isolation regions 69, which are the subject of the aforementioned U.S. Pat. No. 4,641,416.

As illustrated in FIG. 5, the collector region 58 is not "walled" against the base and emitter regions 62 and 68, as was the case in device 37 of FIG. 4. Since the separation between the collector region 58 and the base and emitter regions 62 and 68 is large compared with vertical dimensions, other device optimization considerations are made. For example, the collector insulating layer 76 is optional and may be omitted. Also, the local collector diffusion is not useful in this embodiment. Optimization of the fill material, however, can make this structure preferrable to prior art structures.

In summary, the slot collector transistors 37 (FIG. 4) and 56 (FIG. 5) of the present invention have the following beneficial features:

(1) The collector region and base/emitter regions can be separated by as little as the width of an insulating layer; the width of the insulating layer, furthermore, is independent of photolithography;

(2) A local collector doped region (see region 36, FIG. 3) can be formed under the collector region and active base regions to provide a further reduction in collector resistance; the insulating layer prevents the high concentration regions (local collector and active base) from contacting each other;

(3) If the local collector doped region is included, the heavily doped buried collector layer, often associated with high performance bipolar transistors, can be eliminated, which, in turn, allows elimination of the expitaxial layer;

(4) A very high Gummel number can be provided by filling the slot with material having a large band gap (i.e. creating a heterojunction) and eliminating other regions where recombination can occur (e.g. the heavily doped buried collector layer).

The foregoing description of specific embodiments of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto and their equivalents.

What is claimed is:

1. In an integrated circuit having multiple active transistor regions, a bipolar transistor formed in a semiconductor substrate of a first conductivity type, said transistor comprising:

a collector diffusion region of a second conductivity type formed in said substrate of a first conductivity type, said collector diffusion region having a depth less than the depth of said substrate, wherein said collector diffusion region serves as the active region of said bipolar transistor;

a slot collector region formed in said collector diffusion region, said slot collector region having a depth less than the depth of said collector diffusion region;

a collector insulating layer formed in said collector diffusion region, on a first sidewall of said slot collector region, said collector insulating layer extending to a depth less than the depth of said slot collector region;

a base region formed in said collector diffusion region, said base region having a depth less than the depth of said collector insulating layer, and wherein a first side of said base region is adjacent to, and in contact with, said collector insulating layer such that said collector insulating layer operates to isolate said base region from said slot collector region;

an emitter region of a second conductivity type formed in said base region of a first conductivity type, said emitter region extending to a depth less than the depth of said base region, and wherein a first side of said emitter region is adjacent to, and in contact with, said collector insulating layer such that said collector insulating layer operates to isolate said emitter region from said slot collector region;

a first slot isolation region formed in said substrate, said first slot isolation region having a depth in said substrate greater than the depth of said collector diffusion region, and wherein one wall of said first slot isolation region is adjacent to, and in contact with, a second side of said base region and is also adjacent to, and in contact with, a first side of said collector diffusion region, such that said first slot isolation region operates to isolate said active region of said bipolar transistor from another of said multiple active regions;

a second slot isolation region formed in said substrate, said second slot isolation region having a depth greater than the depth of said collector diffusion region, and wherein one wall of said second slot isolation region is adjacent to, and in contact with, a second wall of said slot collector region, and is also adjacent to, and in contact with, a portion of a second side of said collector diffusion region, such that said second slot isolation region operates to isolate said active region of said bipolar transistor from another of said multiple active regions;

said base region including an intrinsic base region having a fist side adjacent to, and in contact with, said collector insulating layer, said base region also including an extrinsic base region having a first side adjacent to, and in contact with, a second side of said intrinsic base region and a second side of said extrinsic base region adjacent to, and in contact with, said first slot isolation region; and wherein said emitter region is formed entirely within said intrinsic base region and said emitter region is isolated from said extrinsic base region by an emitter isolating region formed between said emitter region and said extrinsic base region; and wherein said slot collector region comprises a slot formed in said collector diffusion region, said slot being filled with a conductive filler material.

2. A bipolar transistor in accordance with claim 1 further including an impurity region of a second conductivity type formed in said substrate underlying said slot collector region, wherein said impurity region extends to a depth greater than said collector diffusion region but to a depth less than said second slot isolation region, and wherein a portion of said impurity region is adjacent to, and in contact with, said second slot isolation region.

3. A bipolar transistor in accordance with claim 1 further including a masking layer formed over an upper surface of said substrate except over upper surfaces of said extrinsic base and emitter regions and over a portion of an upper surface of said slot collector region.

4. A bipolar transistor in accordance with claim 3 further including conductive lines formed over said upper surfaces of said extrinsic base and emitter regions and over said portion of said upper surface of said slot collector region.

5. In an integrated circuit having multiple active transistor regions, a bipolar transistor formed in a semiconductor substrate of a first conductivity type, said transistor comprising:

a buried collector layer of a second conductivity type formed in said substrate, entirely below an upper surface of said substrate;

a slot collector region formed in said substrate, said slot collector region having a depth less than the depth of said buried collector layer;

a base region of a first conductivity type formed in said substrate, said base region having a depth less than the depth of said slot collector region, said base region being adjacent to, but spaced laterally apart from, said slot collector region;

an emitter region of a second conductivity type formed in said base region, said emitter region extending to a depth less than the depth of said base region;

a collector insulating layer formed on first and second sidewalls of said slot collector region, said collector insulating layer formed to a depth less than the depth of said slot collector region;

a first slot isolation region formed in said substrate, said first slot isolation region having a depth in said substrate greater than the depth of said buried collector layer, said first slot isolation region being adjacent to, but spaced laterally apart from, said collector insulating layer formed on the second sidewall of said slot collector region;

a second slot isolation region formed in said substrate, said second slot isolation region having a depth in said substrate greater than the depth of said buried collector layer, said second slot isolation region being adjacent to, but spaced laterally apart from, said base region, such that said first and second slot isolation regions surround said base, emitter and slot collector regions, thereby operating to isolate said base, emitter and slot collector regions from others of said multiple active transistor regions;

said base region including an intrinsic base region having first and second sides, and said base region further including first and second extrinsic base regions, said first extrinsic base region being formed adjacent to, and, in contact with, said first side of said intrinsic base region, and said second extrinsic base region being formed adjacent to, and in contact with, said second side of said intrinsic base region;

wherein said emitter region is formed entirely within said intrinsic base region and said emitter region is isolated from said first and second extrinsic base regions by first and second emitter isolation regions formed between said emitter region and said first and second extrinsic base regions, respectivley; and wherein said slot collector region comprises a slot formed in said substrate, said slot being filled with conductive filler material.

6. A bipolar transistor in accordance with claim 5, further including a masking layer formed over an upper surface of said substrate, except over portions of upper surfaces of said first extrinsic base region and said emitter region and except over an upper surface of said slot collector region.

7. A bipolar transistor in accordance with claim 6, further including conductive lines formed over said portions of said upper surfaces of said emitter and extrinsic base regions, and over said upper surface of said slot collector region.

* * * * *